(12) United States Patent
Lee

(10) Patent No.: US 8,883,590 B2
(45) Date of Patent: Nov. 11, 2014

(54) PHASE CHANGE MEMORY APPARATUS AND FABRICATION METHOD THEREOF

(71) Applicant: SK Hynix Inc., Gyeonggi-do (KR)

(72) Inventor: Jang Uk Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 60 days.

(21) Appl. No.: 13/731,522

(22) Filed: Dec. 31, 2012

(65) Prior Publication Data

US 2013/0157434 A1 Jun. 20, 2013

Related U.S. Application Data

(62) Division of application No. 12/647,600, filed on Dec. 28, 2009, now Pat. No. 8,368,178.

(30) Foreign Application Priority Data

Jun. 29, 2009 (KR) .......................... 10-2009-0058088

(51) Int. Cl.
*H01L 21/8234* (2006.01)
*H01L 27/24* (2006.01)
*H01L 45/00* (2006.01)

(52) U.S. Cl.
CPC ............ *H01L 45/16* (2013.01); *H01L 27/2409* (2013.01); *H01L 45/1233* (2013.01); *H01L 45/1683* (2013.01); *H01L 45/06* (2013.01)
USPC 438/237; 247/4; 247/E29.327; 247/E21.352; 365/72; 365/175

(58) Field of Classification Search
USPC ............ 438/900, 48, 237, 328, 91, 380, 979, 438/983; 257/4, 5, 46, 104, 106, 109, 481, 257/529, 551, 594, 599, 601, 622, E29.3, 257/27, E21.352; 365/72, 105, 175
See application file for complete search history.

(56) References Cited

U.S. PATENT DOCUMENTS

| | | | |
|---|---|---|---|
| 2006/0284237 A1* | 12/2006 | Park et al. | 257/314 |
| 2008/0111120 A1* | 5/2008 | Lee et al. | 257/2 |
| 2008/0111121 A1 | 5/2008 | Jang et al. | |
| 2008/0315171 A1 | 12/2008 | Happ et al. | |
| 2009/0032897 A1* | 2/2009 | Goerlach et al. | 257/476 |
| 2009/0212275 A1* | 8/2009 | Park et al. | 257/9 |

FOREIGN PATENT DOCUMENTS

| | | |
|---|---|---|
| JP | 2008-131042 A | 6/2008 |
| JP | 2008-306011 A | 12/2008 |
| KR | 10-0780964 B1 | 11/2007 |
| KR | 1020090088007 A | 8/2009 |

OTHER PUBLICATIONS

USPTO RR mailed Oct. 4, 2011 in connection with U.S. Appl. No. 12/647,600.

(Continued)

*Primary Examiner* — Benjamin Sandvik
*Assistant Examiner* — Leslie Pilar Cruz
(74) *Attorney, Agent, or Firm* — Ladas & Parry LLP

(57) ABSTRACT

A phase change memory apparatus is provided that includes a first electrode that is longer than it is wide, the first electrode having a trench formed on an active region of a semiconductor substrate, a second electrode formed in a bottom portion of the trench, and a bottom electrode contact formed on the second electrode.

8 Claims, 7 Drawing Sheets

(56) References Cited

OTHER PUBLICATIONS

USPTO NFOA mailed Dec. 22, 2011 in connection with U.S. Appl. No. 12/647,600.

USPTO FOA dated Jul. 13, 2012 in connection with U.S. Appl. No. 12/647,600.

USPTO NOA mailed Oct. 2, 2012 in connection with U.S. Appl. No. 12/647,600.

* cited by examiner

PHASE CHANGE MEMORY APPARATUS AND FABRICATION METHOD THEREOF

CROSS-REFERENCES TO RELATED APPLICATION

The present application claims priority under 35 U.S.C. 119(a) to Korean application number 10-2009-0058088, filed on Jun. 29, 2009, in the Korean Patent Office, which is incorporated by reference in its entirety as if set forth in full.

BACKGROUND

1. Technical Field

The inventive concept relates to a semiconductor memory apparatus and, more particularly, to a phase change memory apparatus and a method of manufacturing the same.

2. Related Art

A phase change random access memory (PCRAM) device is regarded as a non-volatile memory device and has a fast operation speed and a high integration.

The phase change memory device includes a switching device to select a memory cell. Currently, a diode is used for the switching device of the PCRAM device. The diode is formed by forming an insulating layer having a hole type pattern on an active region of a semiconductor substrate, forming a selective epitaxial growth (SEG) layer within the hole type pattern of the insulating layer through a SEG process, and implanting ions into the SEG layer.

As shrinkage of the device increases, it lacks a margin for the hole type patterns such that it can not form the hole type patterns at a desired size and it is difficult to form the hole type patterns having a uniform size in each of the cell strings. In addition, as a diameter of the hole type pattern decreases, the SEG layer is abnormally grown. The fabrication error causes an amount of diode current flowing through each of the phase change memory cells to vary, thereby deteriorating operational reliability of the device.

Meanwhile, as the PCRAM device is more highly integrated, a word line resistance increases. Accordingly, metal contacts are formed between the cell strings and a metal word line is formed to be connected to the metal contacts. In this case, it can solve the problem of the increase in the word line resistance, but the word line metal contacts should be formed for every unit cell string such that the problem of the increase in the chip size still remains.

In addition, the active region to which the word line metal contacts are connected thereto has a relatively higher resistance as compared with a metal word line. Accordingly, the resistance becomes different relative to the spaced distance between the word line metal contact and the unit cell such that the current driving capacity of the diode becomes different depending on the arrangement position of the selected cell. This results in degradation of the operation uniformity, as the number of unit cells constituting the cell string increases. Therefore, it limits the number of unit cells contained in the cell string such that a large number of word line metal contacts are necessary.

SUMMARY

The inventive concept provides a phase change memory apparatus capable of scaling down the diode size in response to shrinkage of the device and forming a diode having a uniform size and a method of manufacturing the same.

The inventive concept is to provide a uniform current driving capacity of a diode in a memory cell constituting a cell string. According to one aspect of an exemplary embodiment, a phase change memory device includes a first electrode that is longer than it is wide, the first electrode having a trench formed on an active region of a semiconductor substrate, a second electrode formed in a bottom portion of the trench, and a bottom electrode contact formed on the second electrode.

According to another aspect of another exemplary embodiment, a method of manufacturing a phase change memory device includes forming a selective epitaxial growth layer on an active region of a semiconductor substrate, forming a trench in the selective epitaxial growth layer, forming an electrode having an opposite conductivity to the selective epitaxial growth layer in a bottom portion of the trench, and forming a bottom electrode contact on the electrode.

These and other features, aspects, and embodiments are described below in the section entitled "DETAILED DESCRIPTION OF EXEMPLARY EMBODIMENTS."

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION OF EXEMPLARY EMBODIMENTS

Figure 1:
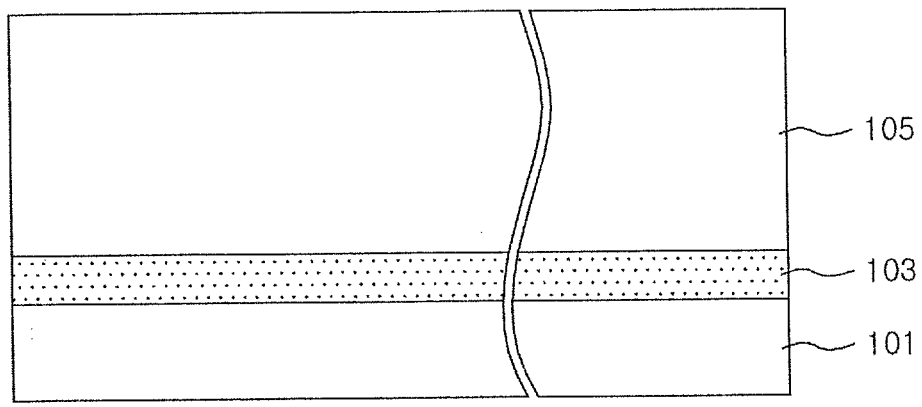
FIGS. 1 through 5 are sectional views illustrating a method of manufacturing a phase change memory apparatus according to an exemplary embodiment.

Hereinafter, the inventive concept will be described in detail by explaining embodiments of the inventive concept with reference to the attached drawings. The inventive concept may, however, be modified in many different forms and should not be constructed as being limited to the embodiments set forth herein. Rather, these embodiments are provided so that this disclosure will be through and complete, and will be fully convey the inventive concept to one of ordinary skill in the art. In the drawings, shapes of the elements, etc. may be exaggerated for clarity. Like reference numerals in the drawings denote like elements. It is also understood that when a layer is referred to as being "on" another layer or substrate, it can be directly on the other or substrate, or intervening layers may also be present.

In an exemplary embodiment of the inventive concept, a SEG layer that is longer than it is wide is formed on an active region and then patterned in a trench shape to form a diode. According to this, the patterning margin can be sufficiently ensured to make a diode size to be smaller and to form a diode in a uniform size such that the uniform operation property of the unit cell can be ensured.

Meanwhile, in an exemplary embodiment of the inventive concept, a trench is formed in the SEG layer that is longer than it is wide and the SEG layer is used for a first electrode of the diode, while a second electrode of the diode is formed within the trench. According to this, the SEG layer can be used as a current flow path to make the current driving capacity of the diode uniform.

FIGS. 1 through 5 are sectional views illustrating a phase change memory device according to an exemplary embodiment. Referring to FIG. 1, an active region 103 is formed in a semiconductor substrate 101 through an ion implantation process and a SEG layer 105 that is longer than it is wide is grown on the active region 103. Although not shown in drawings, an insulating layer may be formed at both sides of the SEG layer 105 to isolate the SEG layer 105.

Figure 2:
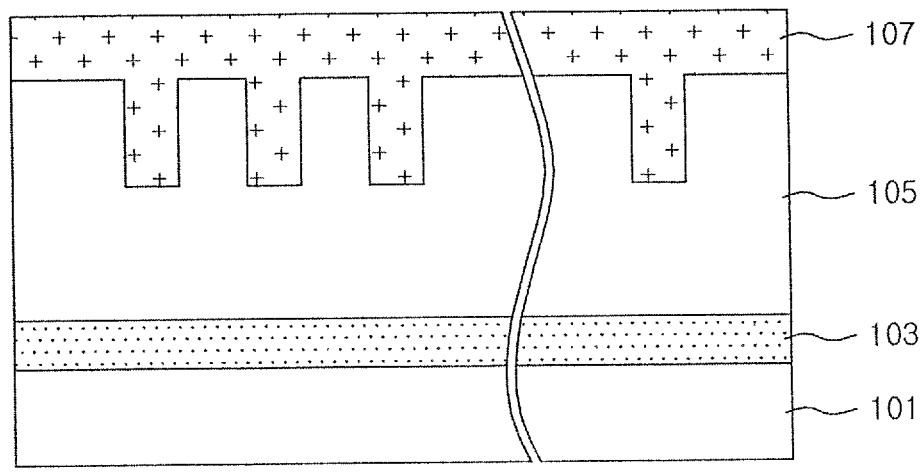

Next, referring to FIG. 2, a trench is formed in the SEG layer 105 at a desired depth using a bottom electrode contact mask (not shown). A metal layer 107 is formed on the resultant structure of the semiconductor substrate 101 to be buried within the trench.

Figure 3:
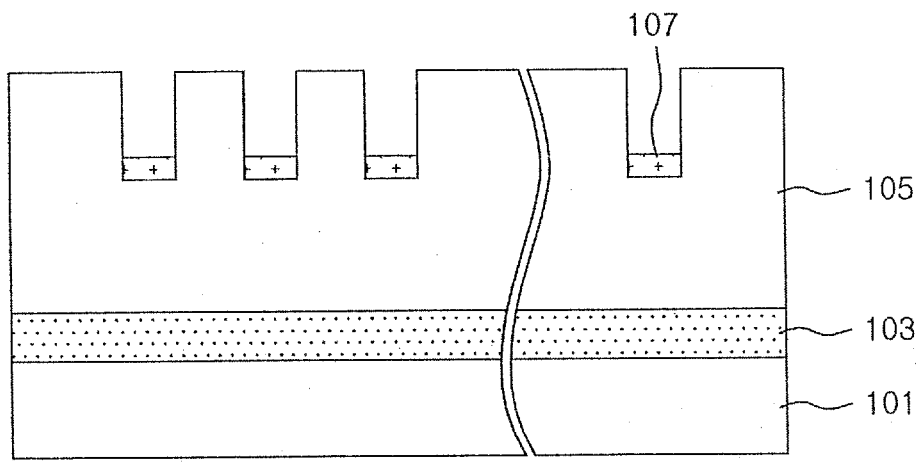

Subsequently, referring to FIG. 3, the metal layer 107 is etched back to remain on a bottom portion of the trench, thereby forming a Schottky diode having the SEG layer 105 as a first electrode and the metal layer 107 as a second electrode. That is, since The SEG layer 105 that is formed longer than it is wide is patterned in a trench shape, the pattern margin can be sufficiently ensured irregardless of an increase in shrinkage of the device and each of the diodes can be formed in a uniform size. Accordingly, an amount of current in each of the diodes can be uniformly controlled.

Figure 4:
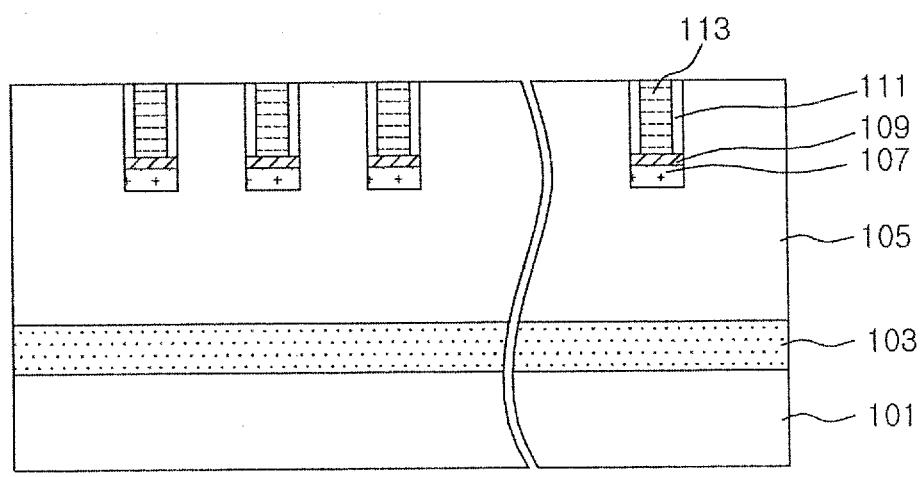

Referring to FIG. 4, a conductive material is deposited on the resultant structure of the semiconductor substrate 101 and then etched back to form a bottom electrode contact 109 by determined height on the metal layer 107. Subsequently, an insulating layer is deposited and etched back to form spacers 111 on the side wall of the trench and then a phase change material layer 113 is buried within the trench.

Herein, the trench is formed in the SEG layer 105 by using the bottom electrode contact mask such that the diode 105 and 107 and the bottom electrode contact 109 are formed to be self aligned. Accordingly, irregardless of an increase in shrinkage, the metal layer 107 as the second electrode is accurately aligned with the bottom electrode contact 109, thereby improving fabrication reliability.

Meanwhile, although the phase change material layer 113 is formed to be buried within the trench of the SEG layer 105 in the exemplary embodiment, the inventive concept is not limited thereto. That is, the metal layer 107 and the bottom electrode contact 109, for example, may be buried within the trench of the SEG layer 105 and the phase change material layer may be formed to be arranged over the trench.

Figure 5:
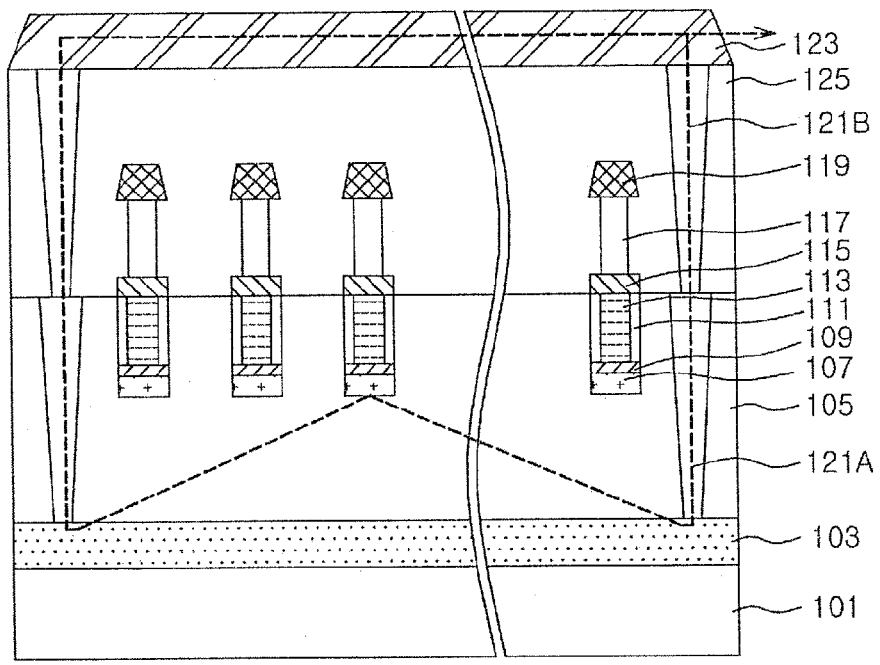

FIG. 5 shows a sectional view of the phase change memory apparatus in which a top electrode 115, a bit line 119 connected to the top electrode 115 through a bit line contact 117, word line contacts 121A and 121B penetrating the SEG layer 105 to be connected to the active region 103, and a word line 123 connected to the word line contacts 121A and 121B are formed, following forming the phase change material layer 113. The reference numeral 125 designates an interlayer insulating layer.

The SEG layer 105 has a lower resistance than the active region 103 such that the current inflowing through the word line 123 and the word line contacts 121A and 121B flows through the SEG layer 105. Accordingly, the resistance difference due to distance from the unit cell to the word line contacts 121A and 121B can be improved. In addition, the current driving capacities of the diodes in unit cells constituting the cell string become uniform such that the number of word line contacts can be minimized.

That is, while the cell string in the prior phase change memory device is comprised of 8 unit memory cells, the cell string in the inventive concept may be comprised of 16, 32 or 64 or more such that the integration of the device can be improved.

Furthermore, in the case where the memory cells having the same chip size as the memory cells in the prior art are fabricated, the spare space is formed due to the reduction of the metal contact such that the margin for the word line contact is increased. According to this, the size of the word line contact can be increased such that the word line resistance is reduced. The reduction in the word line resistance results in reduction in the number of word line contacts. Accordingly, the inventive concept flows the driving current by using the SEG layer and increases the margin for the word line contact such that the reduction effect of the word line contact can be amplified.

In the phase change memory apparatus of FIG. 5, for example, if the third unit cell from the left is selected, the current flows through the path shown by a dotted line. That is, the SEG layer 105 is used for a current flow path. At this time, unselected memory cells may be floating or grounded. Accordingly, the current does not flow through the unselected memory cells such that it can prevent the current leakage in an adjacent bit line and the interference between adjacent bit lines.

In particular, in the exemplary embodiment, the metal layer is used as the second electrode of the diode to form a Schottky diode. The Schottky diode can have a large current flow at a low driving voltage. Therefore, if it adopts the phase change memory device, the switching characteristic can be largely improved.

Figure 6:
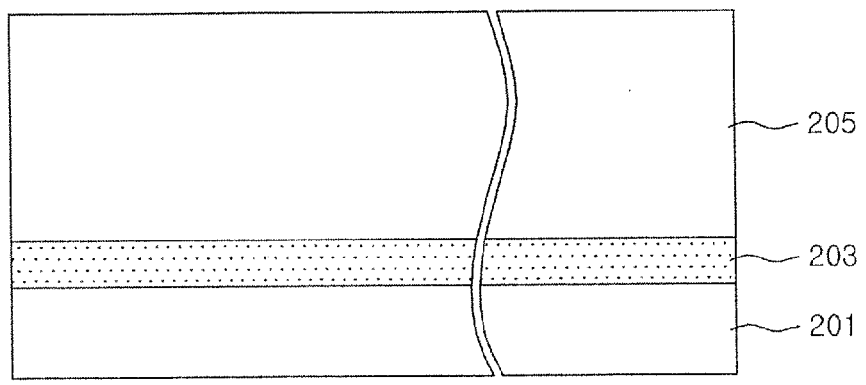
FIGS. 6 through 9 are sectional views illustrating a phase change memory apparatus according to another exemplary embodiment.

However, the inventive concept is not limit to the structure using the Schottky diode and another embodiment will be described with reference to FIGS. 6 through 9. First, FIG. 6 shows a state that an active region 203 and a SEG layer 205 that is longer than it is wide are formed in a semiconductor substrate 201.

Figure 7:
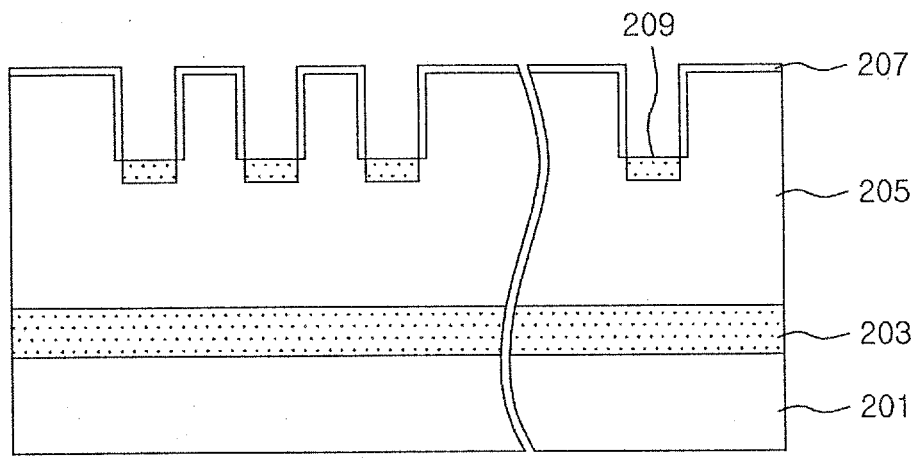

At this state, a trench having a desired depth is formed in the SEG layer 205 by using a bottom electrode contact mask as shown in FIG. 7. The SEG layer 205 having the trench is used as a first electrode of a diode. An insulating layer is deposited on the resultant structure of the semiconductor substrate 201 and then etched back to form spacers 207 on a side wall of the trench. At this time, the insulating layer remaining on the SEG layer 205 may be removed in the following process. Subsequently, an ion implantation layer 209 as a second electrode of the diode is formed through an ion implantation process. The ion implantation layer 209 may be formed, for example, by depositing a material having an opposite conductivity to the SEG layer 205 or implanting ions having an opposite conductivity to the SEG layer 205. In this case, the SEG layer 205 has an N type conductivity and the P+ type conductivity ions are implanted to form the ion implantation layer 209.

Figure 8:
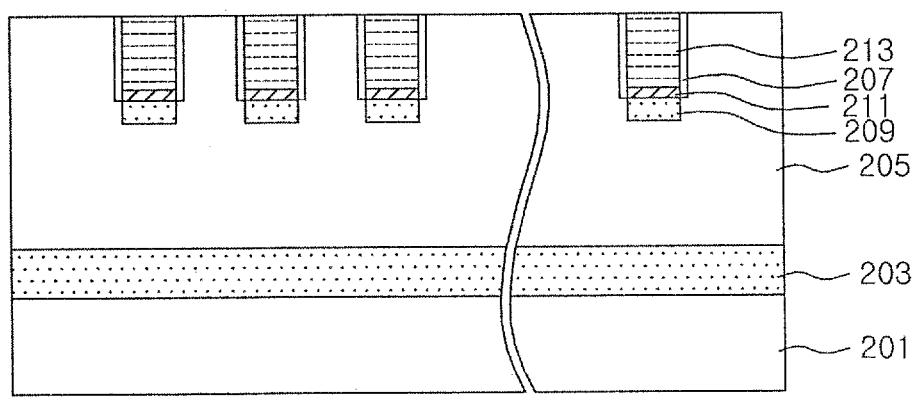

Next, Referring to FIG. 8, a conductive material layer is formed on the resultant structure of the semiconductor substrate 201 and then etched back to form a bottom electrode contact 211 on a bottom portion of the trench. Then, a phase change material layer 213 is buried within the trench. At this time, the bottom electrode contact mask is used to form the trench such that the trench, that is, the diode and the bottom electrode contact 211 are formed with a self-align method and the alignment accuracy can be improved irregardless of an increase in shrinkage of the device.

The exemplary embodiment illustrates the structure that the phase change material layer 213 is buried within the trench, but it is not limited thereto. For example, it may bury the bottom electrode contact within the trench and form the phase change material layer 213 to be protruded from the SEG layer 205.

Figure 9:
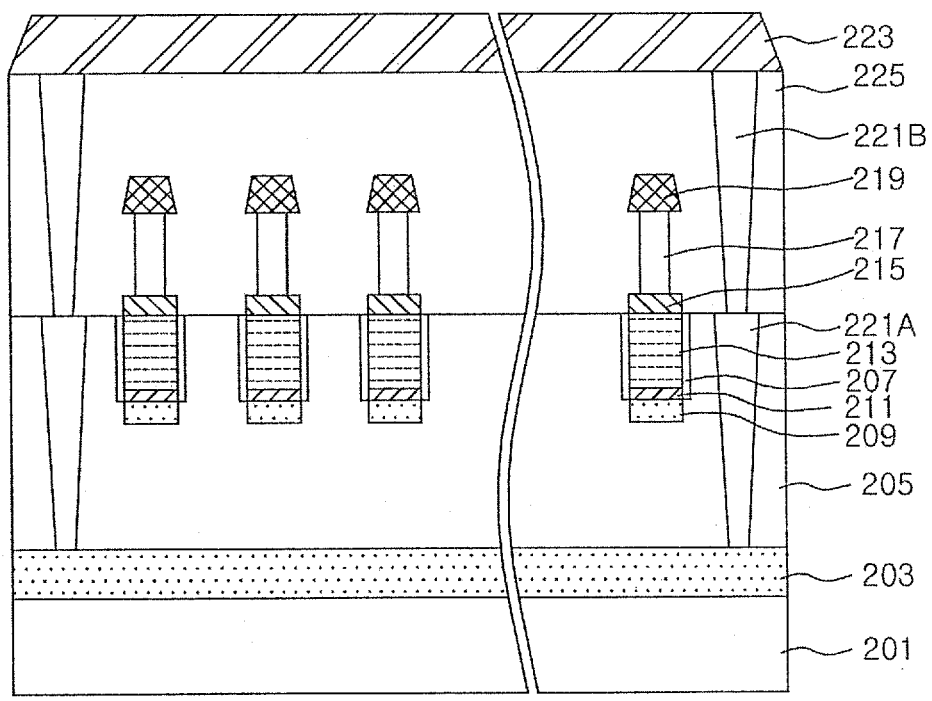

FIG. 9 shows a diagram illustrating the phase change memory device completed by carrying out the following process and shows a top electrode 215, a bit line 219 connected to the top electrode 215 through a bit line contact 217, word line contacts 221A and 221B penetrating through the SEG layer 205 to be connected to the active region 203, and a word line 223 connected to the word line contacts 221A and 221B. The reference numeral 225 designates an interlayer insulating layer.

In the exemplary embodiment, the SEG layer 205 is that is formed longer than it is wide and patterned to form the trench such that the pattern margin for a diode can be sufficiently ensured as well as the size of the unit diode can be made uniform. In addition, the current flows through the SEG layer 205 which has a lower resistance than the active region 203 such that the current driving capacity of the diode in each of the unit memory cells of the cell string can be made uniform, thereby largely reducing the number of word line contacts. Accordingly, the integration of the memory device can be improved and a dimension occupied in forming the word line contact can be increased such that the word line resistance can be reduced.

Figure 10:
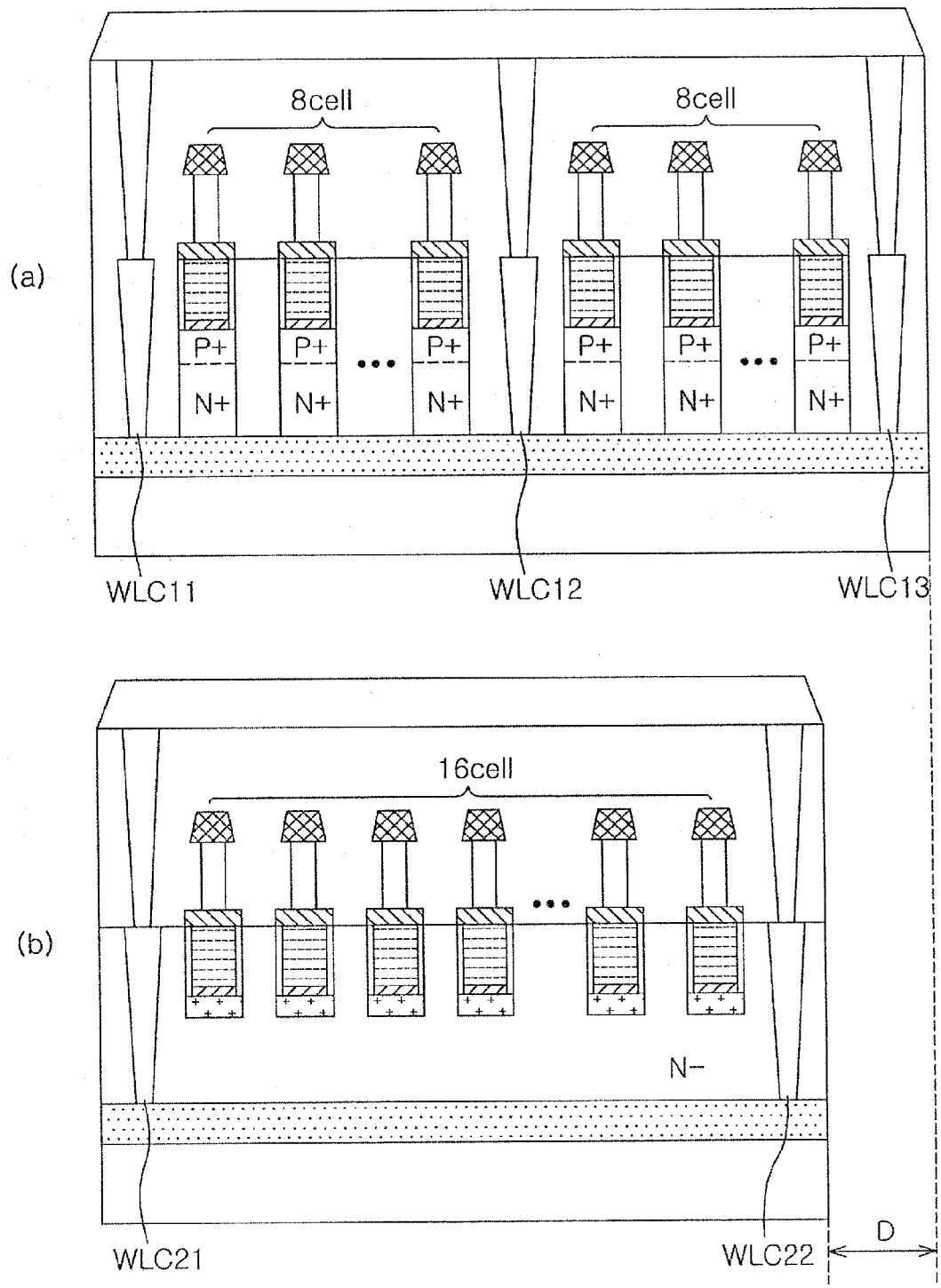
FIG. 10 is a diagram explaining a size reduction in the phase change memory apparatus according to the fabrication process.

FIG. 10 is a diagram explaining a size reduction of the phase memory device according to the above fabrication process, wherein (a) shows the prior phase change memory apparatus that each of the cell strings is comprised of 8 memory cells and the word line contacts WLC11, WLC12 and WLC13 are formed by a cell string unit and wherein (b) shows a sectional view of the phase change memory apparatus in the exemplary embodiment in which the number of word line contacts can be reduced by using the N type SEG layer as a current flow path such that each of the cell strings is comprised of 16 unit memory cells.

Comparing (a) with (b), when the unit cells and word line contacts are formed at the same size between the prior art and the inventive concept, the size of the device can be reduced by "D". In addition, when the phase change memory device is fabricated at the same chip size as the prior art, a contact area of the word line contact can be increased as compared with the prior art such that it can obtain a reduction in the word line resistance.

The word line contacts are formed to solve the problem of an increase in the word line contact resistance. Therefore, if the contact area of the unit word line contact increases, the word line resistance is reduced such that the number of the required word line contacts can be also reduced. Accordingly, if the contact area of the word line contact is properly increased, it can augment the effect of reduction in the word line contact number due to using the SEG layer as a current flow path and the effect of reduction in the word line contact number due to the reduction in the word line resistance.

In the phase change memory apparatus, the word line contact is a required component to reduce the word line resistance. It can not neglect the resistance component in the word line contact formed of a metal material. Accordingly, a method illustrated in FIGS. 11 and 12 is suggested to reduce the resistance of the word line contact.

Figure 11:
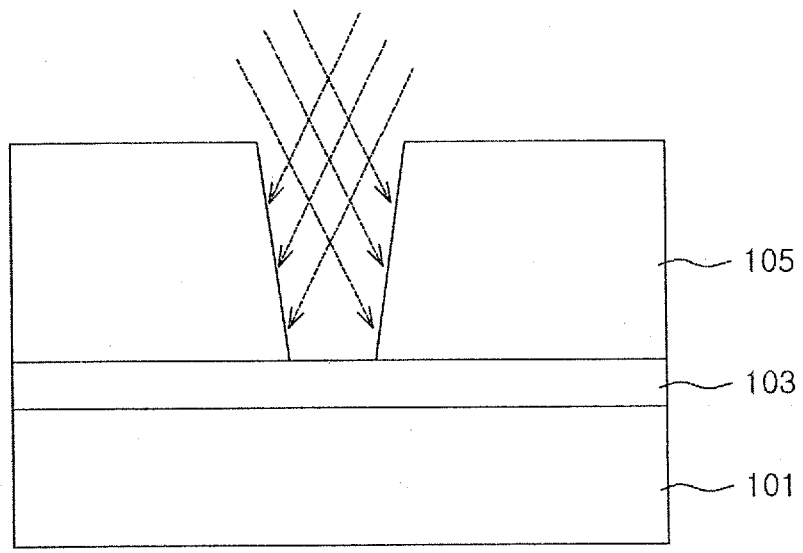
FIGS. 11 through 12 are sectional views illustrating a phase change memory apparatus according to still another exemplary embodiment.
Figure 12:
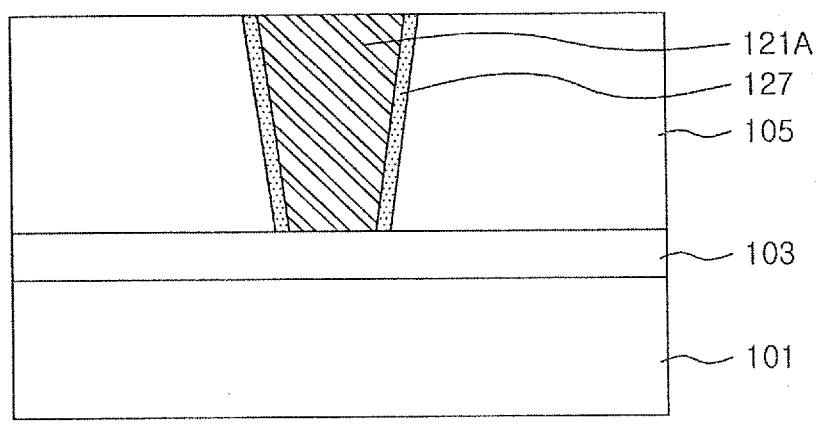

FIGS. 11 and 12 are sectional views illustrating a method of a phase change memory device according to another exemplary embodiment, wherein FIGS. 11 and 12 illustrate a method of manufacturing the word line contact 121A in the phase change memory device of FIG. 5. First, referring to FIG. 11, a portion of the SEG layer 105 that is a word line contact formation region is patterned to form a contact hole. Then, the side wall of the contact hole is ionized by an anisotropic ion implantation process.

According to this, as shown in FIG. 12, an ionization layer 127 is formed and then the word line contact 121A is formed by filling a metal material within the contact hole. When the phase change memory cell operates, the resistance of the word line contact is further reduced due to the ionization layer 127 and the driving property of the device can be improved.

While certain embodiments have been described above, it will be understood that the embodiments described are by way of example only. Accordingly, the devices and methods described herein should not be limited based on the described embodiments. Rather, the devices and methods described herein should only be limited in light of the claims that follow when taken in conjunction with the above description and accompanying drawings.

What is claimed is:

1. A method of manufacturing a phase change memory apparatus, comprising:
    forming a selective epitaxial growth layer on an active region of a semiconductor substrate;
    forming a trench in the selective epitaxial growth layer;
    forming an electrode having an opposite conductivity to the selective epitaxial growth layer in a portion of the trench in order to form a diode by the selective epitaxial growth layer and the electrode; and forming a contact hole in the selective epitaxial growth layer to expose a portion of the active region; forming an ionization layer on a side wall of the contact hole; and forming a word line contact within the contact hole
    forming an electrode contact on the electrode, wherein the electrode contact is formed on the electrode to a determined height within the trench.

2. The method of claim 1, wherein the electrode contact is formed to be self-aligned with the trench.

3. The method of claim 1, wherein the electrode contact comprises a metal material.

4. The method of claim 1, wherein forming the electrode comprises implanting ions having an opposite conductivity to the selective epitaxial growth layer in the selective epitaxial growth layer.

5. The method of claim 1, wherein forming the electrode comprises depositing a material of an opposite conductivity to the selective epitaxial growth layer.

6. The method of claim 5, further comprising forming a phase change material layer on the electrode contact.

7. The method of claim 6, wherein at least one of the phase change material layer and the electrode contact is buried within the trench.

8. The method of claim 1, wherein a length of the selective epitaxial growth layer is greater than a width of the selective epitaxial growth layer.

\* \* \* \* \*